(12) United States Patent
Nath et al.

(10) Patent No.: US 11,656,555 B2
(45) Date of Patent: May 23, 2023

(54) LITHOGRAPHIC APPARATUS AND ILLUMINATION UNIFORMITY CORRECTION SYSTEM

(71) Applicants: ASML HOLDING N.V., Veldhoven (NL); ASML NETHERLANDS B.V., Veldhoven (NL)

(72) Inventors: Janardan Nath, Norwalk, CT (US); Kalyan Kumar Mankala, Bethel, CT (US); Todd R. Downey, Monroe, CT (US); Joseph Harry Lyons, Wilton, CT (US); Ozer Unluhisarcikli, Norwalk, CT (US); Alexander Harris Ledbetter, Fairfield, CT (US); Nicholas Stephen Apone, Fairfield, CT (US); Tian Gang, Best (NL)

(73) Assignees: ASML HOLDING N.V., Veldhoven (NL); ASML NETHERLANDS B V, Veldhoven (NL)

( * ) Notice: Subject to any disclaimer, the term of this patent is extended or adjusted under 35 U.S.C. 154(b) by 41 days.

(21) Appl. No.: 17/605,601

(22) PCT Filed: Apr. 14, 2020

(86) PCT No.: PCT/EP2020/060376
§ 371 (c)(1),
(2) Date: Oct. 22, 2021

(87) PCT Pub. No.: WO2020/216643
PCT Pub. Date: Oct. 29, 2020

(65) Prior Publication Data
US 2022/0214622 A1    Jul. 7, 2022

Related U.S. Application Data

(60) Provisional application No. 62/839,088, filed on Apr. 26, 2019.

(51) Int. Cl.
*G03F 7/20* (2006.01)

(52) U.S. Cl.
CPC ...... *G03F 7/70191* (2013.01); *G03F 7/70083* (2013.01); *G03F 7/70133* (2013.01)

(58) Field of Classification Search
CPC ............. G03F 7/70058; G03F 7/70066; G03F 7/70083; G03F 7/70133; G03F 7/70191; G03F 7/70558
See application file for complete search history.

(56) References Cited

U.S. PATENT DOCUMENTS 6,097,474 A * 8/2000 McCullough ....... G03F 7/70358
355/53
7,511,799 B2  3/2009 Tel et al.
(Continued)

FOREIGN PATENT DOCUMENTS

JP   2002184676   6/2002
WO   2014016163   1/2014

OTHER PUBLICATIONS

International Search Report and Written Opinion issued in corresponding PCT Patent Application No. PCT/EP2020/060376, dated Jul. 20, 2020.

*Primary Examiner* — Peter B Kim
(74) *Attorney, Agent, or Firm* — Pillsbury Winthrop Shaw Pittman, LLP

(57) ABSTRACT

An illumination adjustment apparatus, to adjust a cross slot illumination of a beam in a lithographic apparatus, includes a plurality of fingers to adjust the cross slot illumination to conform to a selected intensity profile. Each finger has a distal edge that includes at least two segments. The two segments form an indentation of the distal edge.

20 Claims, 7 Drawing Sheets

(56) References Cited

U.S. PATENT DOCUMENTS

| | | |
|---|---|---|
| 8,629,973 B2 | 1/2014 | Zimmerman et al. |
| 9,134,620 B2 | 9/2015 | Zimmerman |
| 2003/0227603 A1* | 12/2003 | Dierichs ............. G03F 7/70091 |
| | | 430/311 |
| 2006/0126036 A1 | 6/2006 | Kremer et al. |
| 2006/0244941 A1 | 11/2006 | Gruner et al. |
| 2009/0257042 A1* | 10/2009 | Komatsuda ......... G03F 7/70216 |
| | | 355/71 |

* cited by examiner

LITHOGRAPHIC APPARATUS AND ILLUMINATION UNIFORMITY CORRECTION SYSTEM

CROSS-REFERENCE TO RELATED APPLICATIONS

This application is the U.S. national phase entry of PCT Patent Application No. PCT/EP2020/060376, which was filed Apr. 14, 2020, which claims the benefit of priority of U.S. Provisional Patent Application No. 62/839,088, which was filed on Apr. 26, 2019, and which is incorporated herein in its entirety by reference.

FIELD

The present disclosure relates to a lithographic apparatus and illumination uniformity correction system, for example, a system and method for correcting illumination non-uniformities in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

A lithographic apparatus typically includes an illumination system that conditions radiation generated by a radiation source before the radiation is incident upon a patterning device. The illumination system may, for example, modify one or more properties of the radiation, such as polarization and/or illumination mode. The illumination system may include a uniformity correction system that corrects or reduces non-uniformities (e.g., intensity non-uniformities) present in the radiation. Uniformity correction devices may employ actuated fingers that are inserted into an edge of a radiation beam to correct intensity variations. A spatial breadth of illumination that can be adjusted by a uniformity correction system is dependent on, inter alia, sizes of the fingers and of the actuating devices used to move fingers in the uniformity correction system. Modifying finger parameters from a known working design is not trivial as such modifications can lead to undesirable alterations of one or more properties of a radiation beam.

In order to achieve tolerances of image quality on a patterning device and substrate, an illumination beam having a controlled uniformity is desirable. It is common for an illumination beam to have a non-uniform intensity profile before reflecting off of or transmitting through a patterning device. It is desirable at various stages in a lithographic process that the illumination beam be controlled to achieve improved uniformity. Uniformity can refer to a constant intensity across a pertinent cross section of the illumination beam, but can also refer to the ability to control the illumination to achieve selected uniformity parameters. A patterning device imparts a pattern onto a beam of radiation that is then projected onto a substrate. Image quality of this projected beam is affected by the uniformity of the beam.

Accordingly, it is desirable to control illumination uniformity so that lithographic tools perform lithography processes as efficiently as possible for maximizing manufacturing capacity and yield rates, minimizing manufacturing defects, and reducing cost per device.

SUMMARY

In some embodiments, an illumination adjustment apparatus to adjust a cross slot illumination of a beam in a lithographic apparatus comprises a plurality of fingers configured to adjust the cross slot illumination to conform to a selected intensity profile. Each finger has a distal edge that comprises at least two segments. At least two segments form an indentation of the distal edge.

In some embodiments, a uniformity correction system to adjust a cross slot illumination of a scanning beam in a lithographic apparatus comprises a plurality of fingers configured to adjust the cross slot illumination to conform to a selected intensity profile. Each finger has a distal edge comprising at least two teeth.

In some embodiments, a lithographic apparatus comprises an illumination system, an illumination adjustment apparatus, a support, and a projection system. The illumination adjustment apparatus comprises a plurality of fingers. Each finger has a distal edge comprising at least two segments and the at least two segments form an indentation of the distal edge. The illumination system is configured to produce a beam of radiation, the beam comprising a cross slot illumination. The plurality of fingers is configured to adjust the cross slot illumination to conform to a selected intensity profile. The support is configured to support a patterning device configured to impart a pattern on the beam. The projection system is configured to project the patterned beam onto a substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
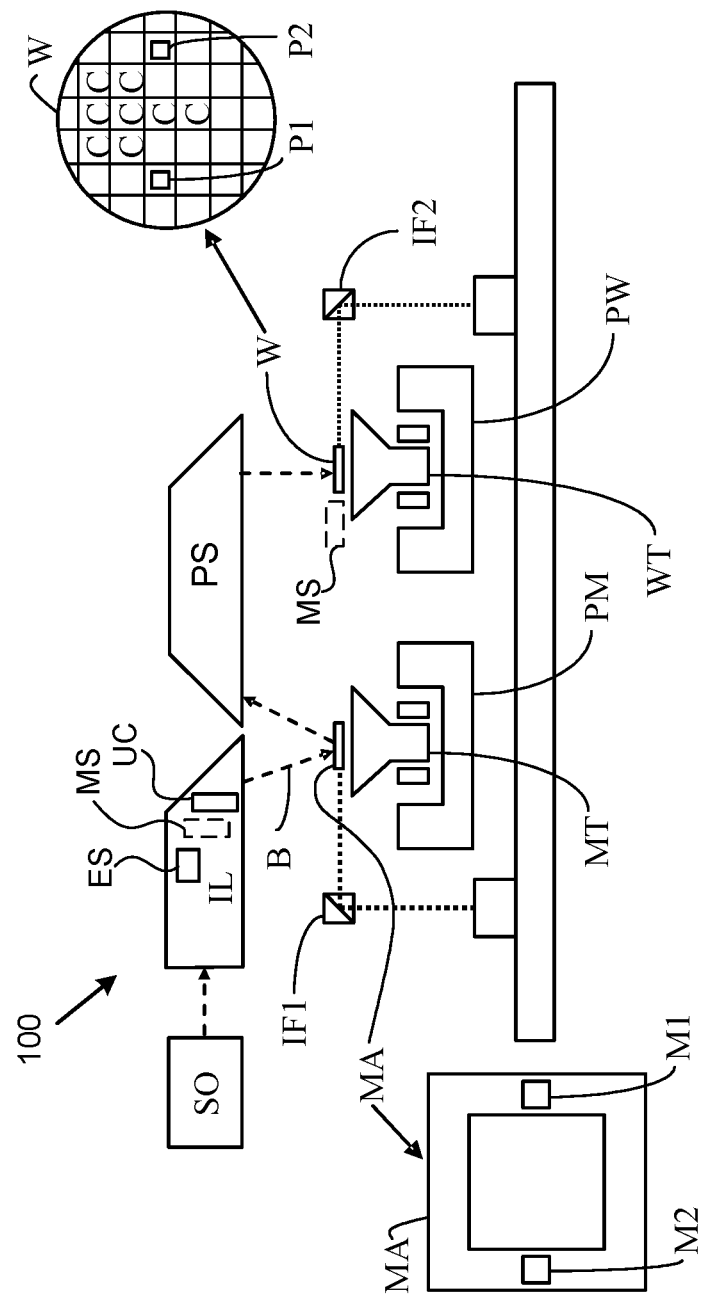
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
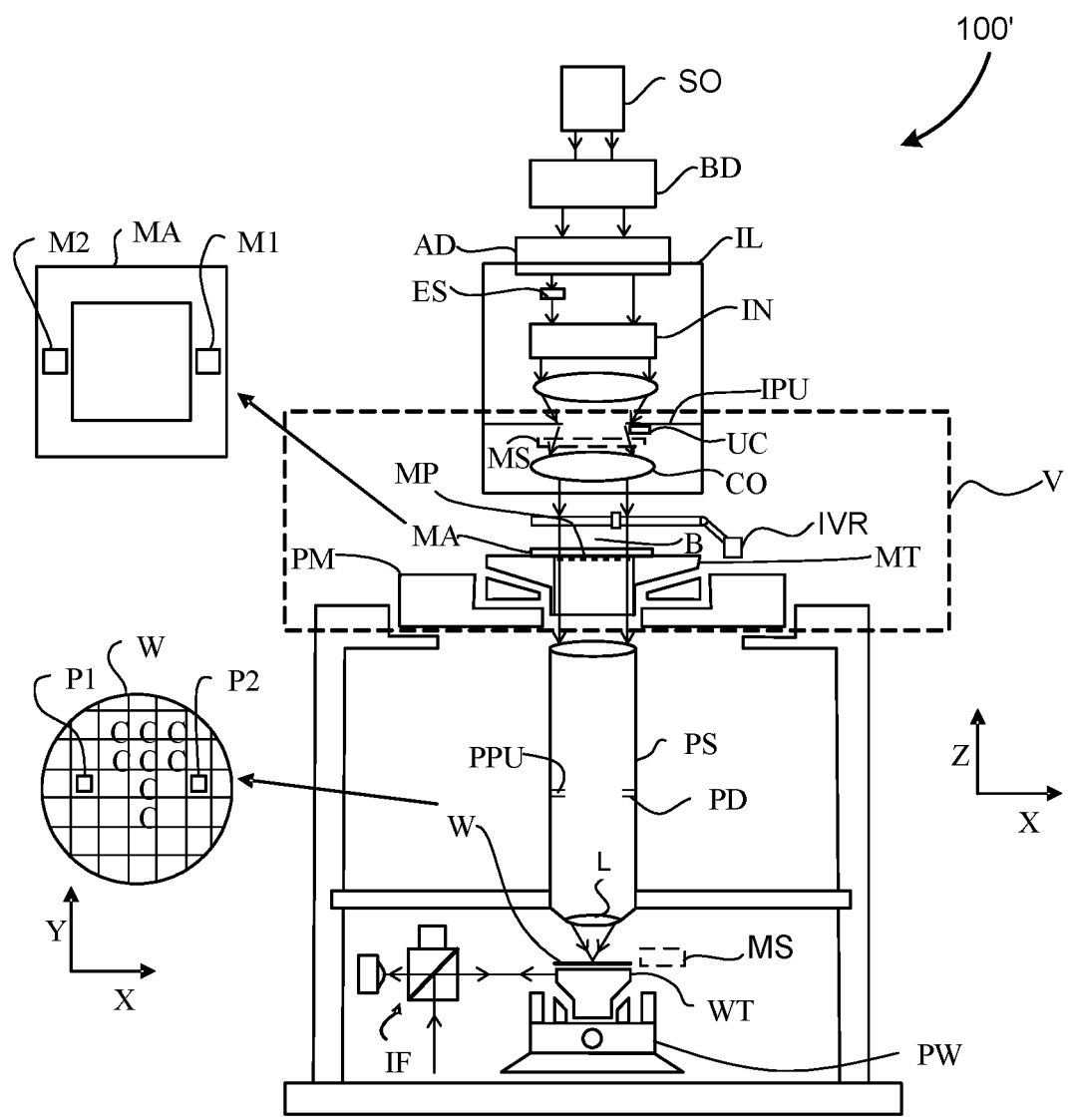
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B. The illumination system IL can also include an energy sensor ES that provides a measurement of, for example, one or more of energy per pulse, photon energy, intensity, average power, and the like. Illumination system IL can include a measurement sensor MS for measuring a movement of the radiation beam B and uniformity compensators UC that allow an illumination slit uniformity to be controlled. The measurement sensor MS can also be disposed at other locations. For example, the measurement sensor MS can be on or near the substrate table WT.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section. The desired uniformity of radiation beam B can be maintained by using a uniformity compensator UC. Uniformity compensator UC comprises a plurality of protrusions (e.g., fingers) that can be adjusted in the path of radiation beam B to control the uniformity of radiation beam B. A sensor ES can be used to monitor the uniformity of radiation beam B.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU. A desired uniformity of radiation beam B can be maintained by using a uniformity compensator UC to control a uniformity of the radiation beam B. A sensor ES can be used to monitor the uniformity of radiation beam B.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of the vacuum chamber V. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
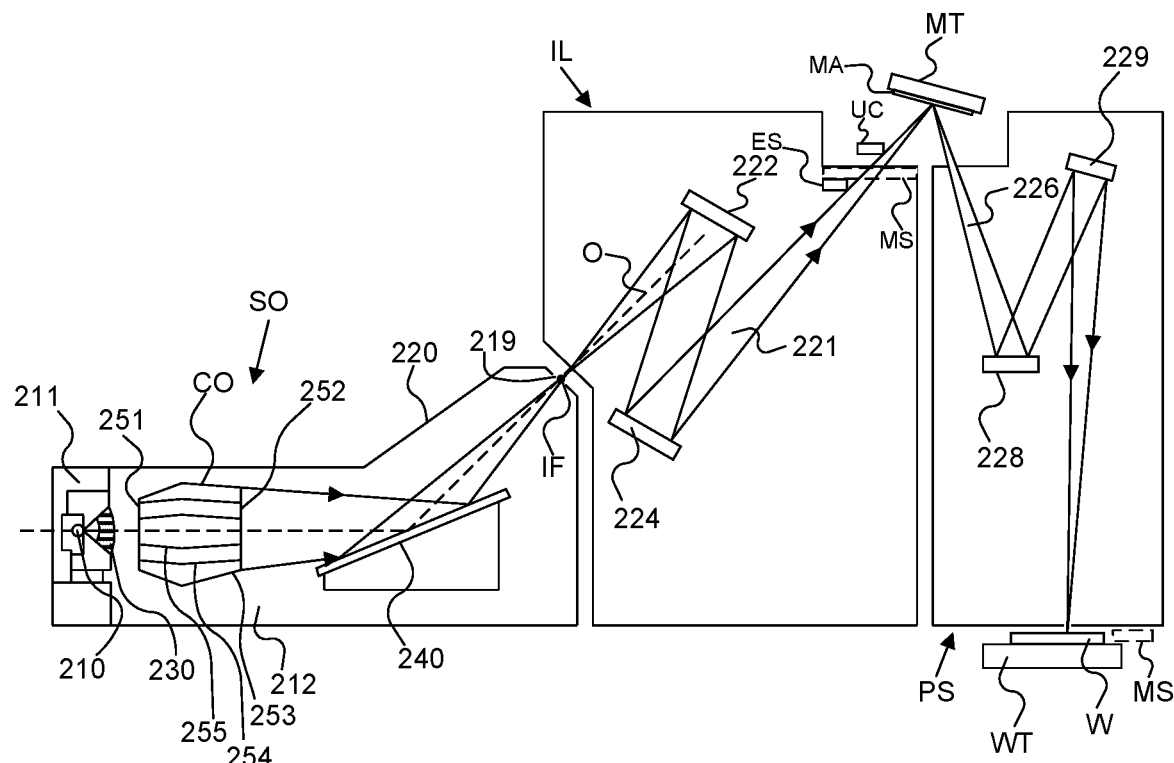
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

In some embodiments, illumination optics unit IL can include a sensor ES that provides a measurement of, for example, one or more of energy per pulse, photon energy, intensity, average power, and the like. Illumination optics unit IL can include a measurement sensor MS for measuring a movement of the radiation beam B and uniformity compensators UC that allow an illumination slit uniformity to be controlled. The measurement sensor MS can also be disposed at other locations. For example, the measurement sensor MS can be on or near the substrate table WT.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
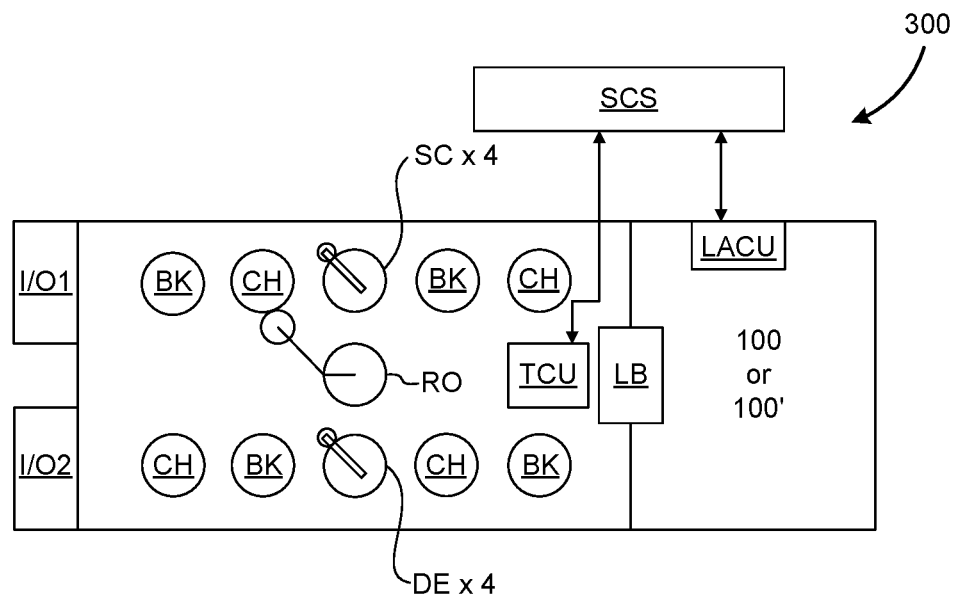
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Uniformity Correction System

Figure 4A:
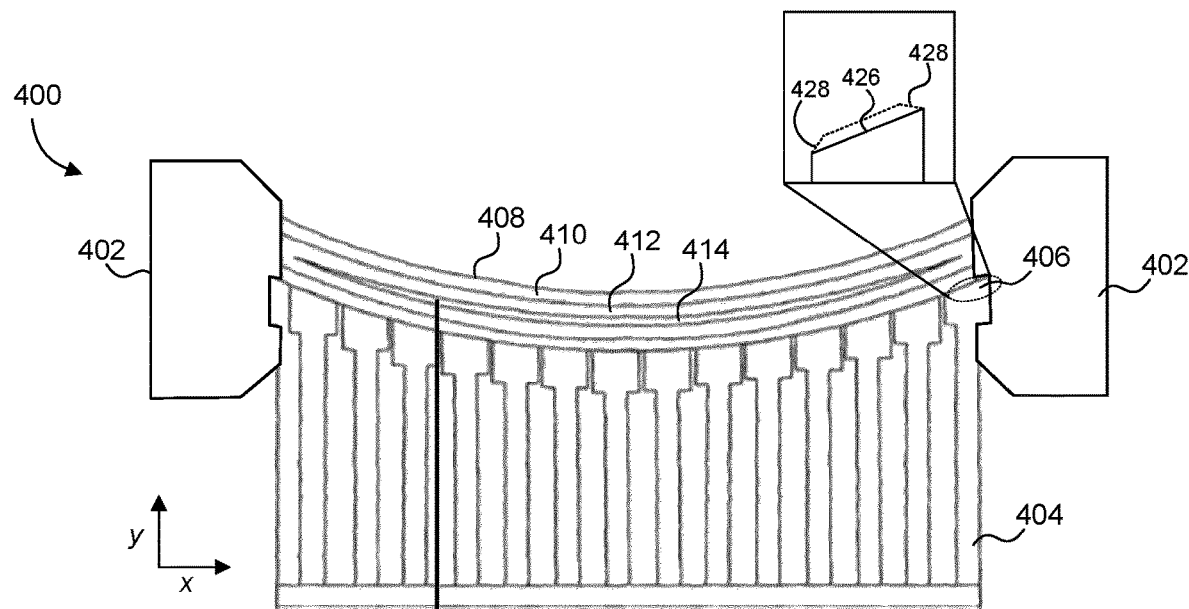
FIG. 4A shows a schematic of a portion of a uniformity correction system, according to some embodiments.

FIG. 4A shows a portion of a uniformity correction system 400 (e.g., uniformity compensator UC in FIGS. 1A, 1B, and 2), according to some embodiments. In some embodiments, uniformity correction system 400 comprises one or more sensors 402 (e.g., sensor ES, FIGS. 1A, 1B, and 2) and a plurality of uniformity compensator elements 404 (e.g., fingers). Each of uniformity compensator elements 404 comprises a distal edge 406.

A cross slot illumination 408 (e.g., a cross section of an illumination beam, or illumination slit) is shown in FIG. 4A. Cross slot illumination 408 is represented as a 2D intensity map with different intensity regions 410, 412, and 414. For example, intensity region 410 has a low relative intensity and is disposed on the outer portion of cross slot illumination 408. Conversely, intensity region 414 has a high relative intensity and is disposed toward the center portion of cross slot illumination 408. In some embodiments, cross slot illumination 408 is generated by using a pupil system (not shown) upstream of uniformity correction system 400 and scanning the beam.

In some embodiments, a shape of the cross slot illumination 408 has a substantially arcuate geometry. Each distal edge 406 comprises a straight distal edge that is oriented to approximately follow a curvature of the arcuate geometry. In some embodiments, a shape of the cross slot illumination 408 has a substantially rectangular geometry (not shown) and each distal edge comprises a straight edge that is oriented to approximately follow a shape of the rectangular geometry. Each of uniformity compensator elements 404 is attached to a corresponding actuator.

In some embodiments, a separation between the centers of each of uniformity compensator elements 404 (e.g., pitch or finger pitch), along the X direction, is between approximately 1-7 mm The reference X-Y coordinates provided in FIG. 4A are for ease of discussion and are not limiting. In some embodiments, a pitch of uniformity compensator elements 404, along the X direction, is approximately 4 mm Uniformity compensator elements 404 can be fabricated with various shaping techniques. For example, in some embodiments, Uniformity compensator elements 404 can be fabricated using electrical discharge machining (EDM).

In some embodiments, uniformity correction system 400 can modify or adjust an illumination beam used in a lithographic operation. For example, each of uniformity compensator elements 404 can be adjusted in the path of the illumination beam (e.g., at least overlapping cross slot illumination 408) using the corresponding actuators to conform an intensity profile of cross slot illumination 408 to a selected intensity profile. Example operations of uniformity compensators can be found in commonly owned U.S. Pat. No. 8,629,973 B2, filed May 28, 2010, and U.S. Pat. No. 9,134,620 B2, filed Apr. 12, 2012, which are incorporated by reference herein in their entirety.

Figure 4B:
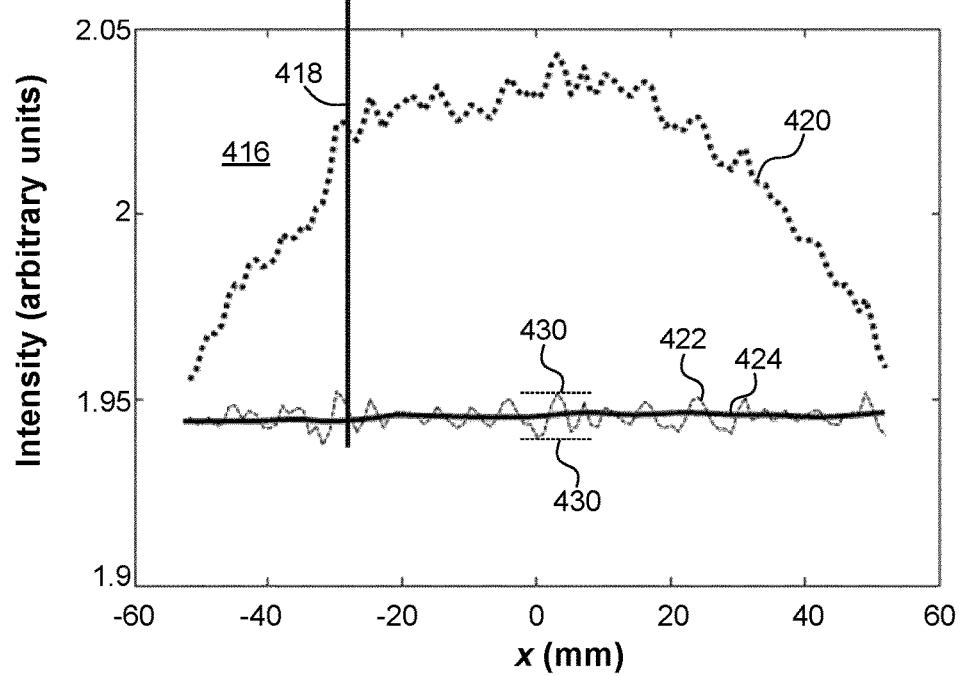
FIG. 4B shows a graph of intensities of a cross slot illumination, according to some embodiments.

FIG. 4B shows a graph 416 of intensities of cross slot illumination 408, according to some embodiments. The vertical axis of graph 416 represents a scan-integrated intensity, I(x), of cross slot illumination 408. In reference to scan integration, the intensities of cross slot illumination 408 can be described in terms of X-Y coordinates, e.g., I(x, y). This 2D representation can be reduced to the 1D representation that is I(x) (e.g., a line power, irradiance, or intensity) by integrating along a so-called scan direction. If the intensity fluctuations along the X direction are of interest, then the scan-integration is performed in the Y direction as shown in the following equation:

$$I(x) = \int_{scan} I(x, y) dy. \qquad (1)$$

The horizontal axis of graph 416 represents a position corresponding with a given X coordinate of cross slot illumination 408. A vertical line 418 is provided for clarifying a correlation between the intensity of cross slot illumination 408 and a given X coordinate. Plot line 420 represents an example scan-integrated intensity profile in the absence of uniformity correction system 400 (e.g., uniformity compensator elements 404 are removed from the path of the illumination beam). At least two types of non-uniformities (e.g., non-flat line) are discernible in plot line 420: (1) an overall trend resembling a global crest and (2) local intensity fluctuations (e.g., small fluctuations having a spatial frequency between approximately 3-5 mm). Local intensity fluctuations can also be referred to herein as short-range or high-frequency (spatial) fluctuations. In order to ensure image quality when performing lithographic processes using cross slot illumination 408, it is important to reduce the two non-uniformities.

In some embodiments, the global crest non-uniformity is treated by using uniformity correction system 400 on cross slot illumination 408. For example, inserting and adjusting uniformity compensator elements 404 in the path of the illumination beam can produce a scan-integrated intensity profile represented by plot line 422. And the scan-integrated intensity profile represented by plot line 424 is one that is desirable for lithographic processes. Plot line 424 exhibits reduction or prevention of local intensity fluctuations (e.g., make the intensity more uniform). Plot line 422 can be produced by using a distal edge 406 that has a straight distal edge 426 that is oriented to approximately follow a geometry of cross slot illumination 408 and/or chamfered (or beveled) edges 428. Here, the dotted line structure represents an alternative version of distal edge 426 represented as a single solid line.

The local intensity fluctuations visible in plot line 420 and plot line 422 can be exacerbated by, e.g., spacing between finger centers (i.e. pitch), pupil configuration, intensity gradient, and finger shapes. Finger pitch and pupil configuration are related. Pupil configuration refers to an arrangement of illumination opening(s) upstream of a uniformity correction system and is not to be confused with cross slot illumination 408.

Figure 5:
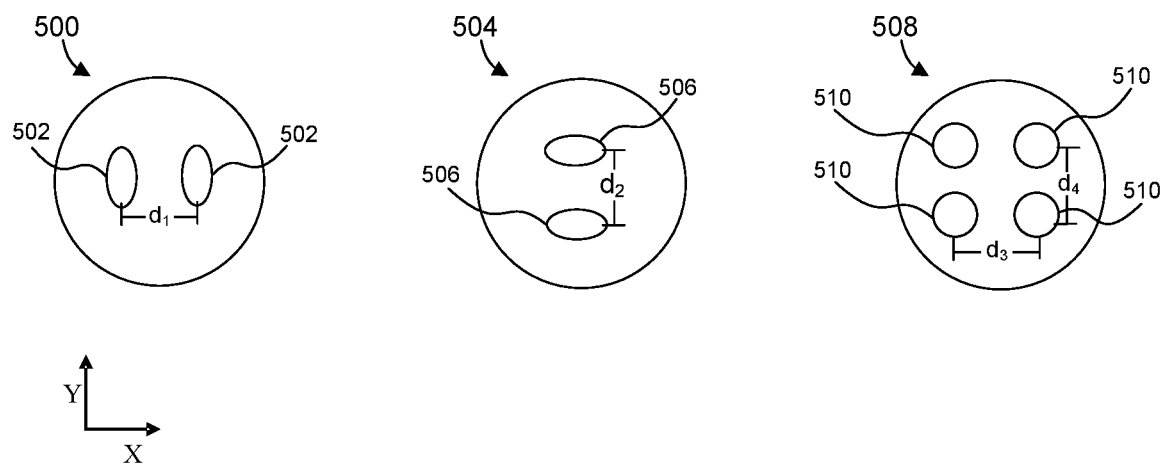
FIG. 5 shows schematics of pupils, according to some embodiments.

A pupil can have one or more openings having a particular size, shape, and arrangements. FIG. 5 shows pupils 500, 504, and 508, according to some embodiments. The X-Y coordinate system shown in FIG. 5 is intended to coincide with the coordinates of FIGS. 4A and 6 for ease of discussion, and thus may or may not coincide with other figures or descriptions. In some embodiments, pupil 500 comprises two openings 502 that are separated by a distance $d_1$ along the X direction. The shapes of openings 502 are ellipses or ellipse-like. The major axes of openings 502 are aligned approximately along the Y direction. In some embodiments, pupil 504 comprises two openings 506 that are separated by a distance $d_2$ along the Y direction. The shapes of openings 506 are ellipses or ellipse-like. The major axes of openings 506 are aligned approximately along the X direction. Due to having two-opening arrangements, pupil 500 and pupil 504 can be described by the term "dipole" (e.g., dipole pupil). In some embodiments, pupil 508 comprises four openings 510. Openings 510 are arranged in a rectangular arrangement. Openings 510 are arranged such that two openings are separated by a distance $d_3$ along the X direction and two openings are separated by a distance $d_4$ along the Y direction. The shapes of openings 506 have at least three-fold symmetry or higher (e.g., a circle has infinite axes of symmetry). Due to having a four-opening arrangement, pupil 508 can be described by the term "quadrupole" (e.g., quadrupole pupil). Other pupil configurations (e.g., opening shapes, number of openings, sizes, spatial arrangement, etc.) are possible and are too numerous to list individually. With an appropriate pupil configuration, the critical dimensions of lithographed structures can be reduced.

As mentioned before, finger pitch and pupil configurations are related. Again referencing FIG. 4A, an issue arises when a pitch of uniformity compensator elements 404 matches a separation of pupil openings, along the direction of the pitch (e.g., $d_1$ of pupil 500 in FIG. 5) being used for generating the illumination beam. If a pitch of uniformity compensator elements 404 is substantially similar to $d_1$, local intensity fluctuations are exacerbated by light leakage between fingers and the resulting intensity profiles resemble those of plot line 420 and plot line 422. It would be reasonable for a skilled artisan to attempt to solve the problem by changing the finger pitch so that it substantially differs from $d_1$. However, modifying finger parameters from a known working design is not trivial. For example, it can be shown by software modeling that changing the finger pitch produces inconsistent results—in some cases amplifying local intensity fluctuations rather than promoting uniformity. Software modeling can be performed using, e.g., optical ray modeling and/or MATLAB, among others.

Besides modifying finger pitch, there are other methods that are capable of more consistently improving uniformity. For example, it can be shown that modifying a shape of the distal edge of fingers can improve uniformity across a variety of pupil configurations.

Figure 6:
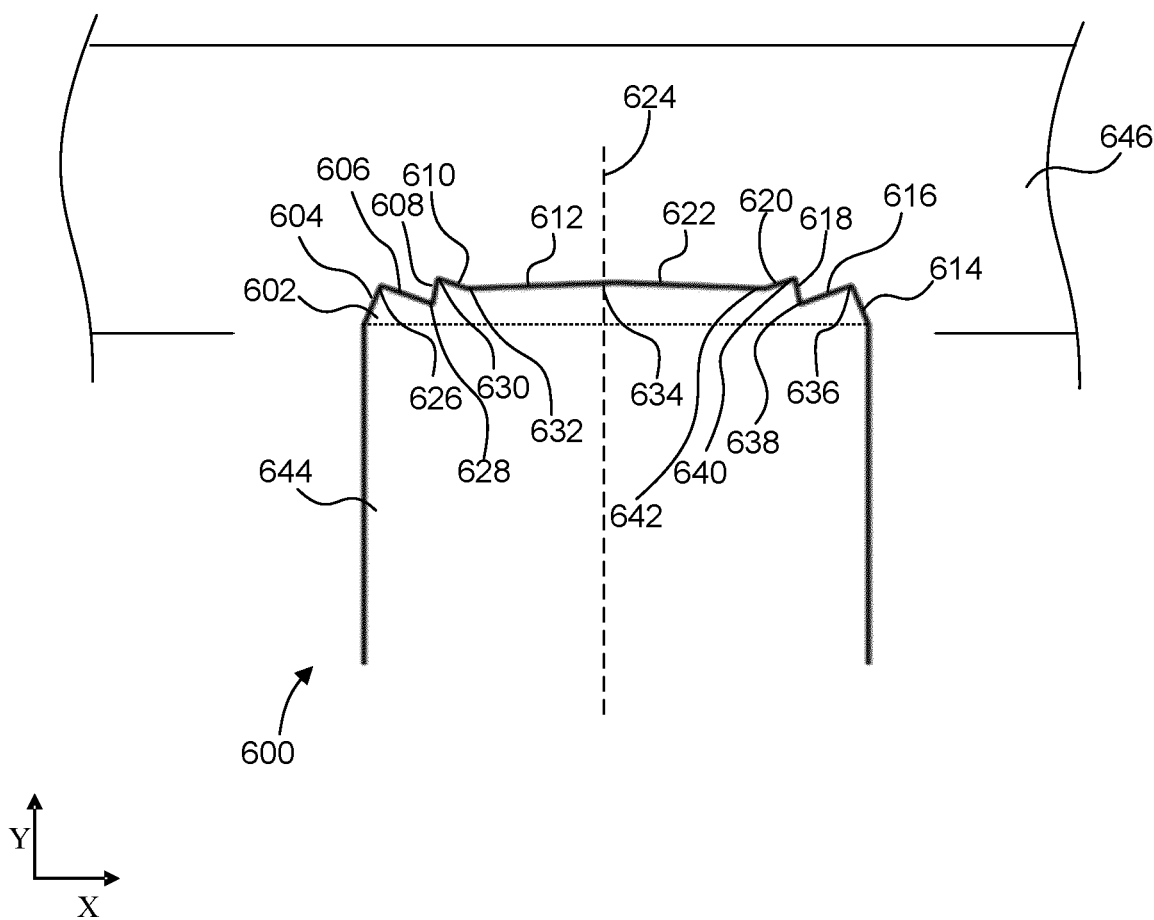
FIG. 6 shows a schematic of a distal edge of a finger used in an illumination adjustment apparatus, according to some embodiments.

FIG. 6 shows a distal edge 602 of a finger used in an illumination adjustment apparatus 600 (e.g., uniformity correction system), according to some embodiments. In some embodiments, distal edge 602 comprises at least two segments (e.g., facets) joined at one vertex. In some embodiments, distal edge 602 can comprise at least four, eight, or ten segments. In some embodiments, distal edge 602 comprises at least two, three, four, five, six, seven, eight, or nine vertices.

In some embodiments, distal edge 602 comprises segments 604, 606, 608, 610, and 612. Distal edge 602 further comprises segments 614, 616, 618, 620, and 622 that correspond with segments 604, 606, 608, 610, and 612. The correspondence is that of mirror symmetry about symmetry line 624. Symmetry line 624 passes through a central position of distal edge 602. Distal edge 602 further comprises vertices 626, 628, 630, and 632. Segments 604, 606, 608, 610, and 612 are joined at vertices 626, 628, 630, and 632 as shown in FIG. 6. Distal edge 602 further comprises vertices 636, 638, 640, and 642. Vertices 636, 638, 640, and 642 have a mirror correspondence with vertices 626, 628, 630, and 632 about a vertex 634 and symmetry line 624. Segments 614, 616, 618, 620, and 622 are joined at vertices 636, 638, 640, and 642 as shown in FIG. 6. The grouping of segments 604, 606, 608, 610, and 612 is joined with the grouping of segments 614, 616, 618, 620, and 622 at vertex 634.

In some embodiments, segments 604, 606, 608, 610, 612, 614, 616, 618, 620, and 622, individually, can be curved or straight. Vertices 626, 628, 630, 632, 634, 636, 638, 640, and 642, individually, can be sharp or curved.

In some embodiments, illumination adjustment apparatus 600 is configured to adjust a cross slot illumination 646 of a beam in a lithographic apparatus. In order to adjust or correct uniformity of cross slot illumination 646, portions of distal edge 602 can protrude out (e.g., teeth) or indent inward. Software modeling shows that a geometry at least one indentation, or at least two teeth, is capable of improving uniformity of a cross slot illumination. Therefore, in some embodiments, at least two segments of distal edge 602 are joined at a vertex to form an indentation of distal edge 602 (e.g., segments 606 and 608 joined at vertex 628, or segments 610 and 612 joined at vertex 632). In some embodiments, distal edge 602 comprises at least four segments that form at least two indentations of distal edge 602. In some embodiments, distal edge 602 comprises at least six segments that form at least three indentations of distal edge 602. In some embodiments, distal edge 602 comprises at least eight segments that form at least four indentations of distal edge 602. For simplicity, we can refer to vertices 628, 632, 638, and 642 as indentations and refer to vertices 626, 630, 634, 636, and 640 as teeth. In some embodiments, distal edge 602 comprises at least three, four, or five teeth.

In some embodiments, a width of distal edge 602 is between approximately 2-12 mm In some embodiments, a width of distal edge 602 is approximately 7 mm. Here, the term "width" is used to characterize a span of the distal edge 602 in the X-direction according to the coordinates shown in FIG. 6.

A plurality of fingers can be constructed for illumination adjustment apparatus 600 by iterating fingers, each finger having a distal edge 602. In some embodiments, a finger pitch of illumination adjustment apparatus 600 is between approximately 1-7 mm. In some embodiments, a finger pitch of illumination adjustment apparatus 600 is approximately 4 mm.

A general orientation of distal edge 602 of each finger iteration can be such that distal edge 602 is substantially aligned to a geometry of cross slot illumination 646. Previously in reference to FIG. 4, it was shown that distal edge 426 aligned to a local edge of cross slot illumination 408 (FIG. 4A). Similarly, cross slot illumination 646 can have a substantially arcuate geometry. In some embodiments, cross slot illumination 646 can have a substantially rectangular geometry. Thus, the orientation of symmetry line 624 shown in FIG. 6 (along Y) should not be construed as limiting. In some embodiments, symmetry line 624 is oriented perpendicular to a local edge of a cross slot illumination. For example, symmetry line 624 can be tilted if distal edge 602 is tilted similar to distal edge 426 in FIG. 4. In some embodiments, distal edge 602 can be substantially asymmetric.

Distal edge 602 can be fabricated with various shaping techniques. For example, in some embodiments, distal edge 602 can be fabricated using electrical discharge machining (EDM).

To solve for a geometry of a finger that can improve cross slot illumination uniformity (e.g., distal edge 602), in some embodiments, optical ray modeling and/or MATLAB can be used in conjunction with a global optimization algorithm (e.g., Monte-Carlo method) and a solver.

Figure 7:
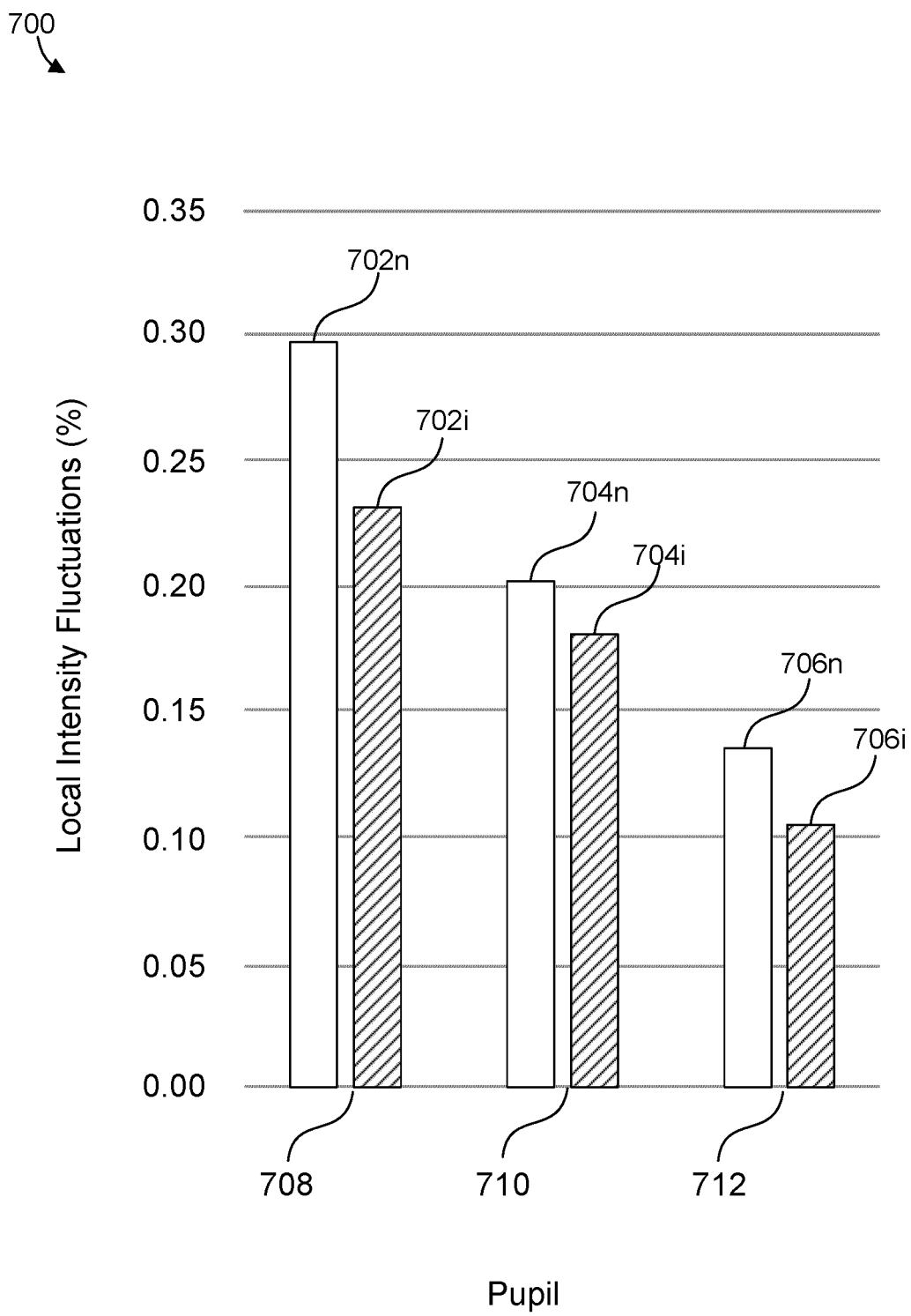
FIG. 7 shows a bar chart of resulting local intensity fluctuations for different pupils and finger geometries, according to some embodiments.

FIG. 7 shows a bar chart 700 of resulting local intensity fluctuations for different pupils and finger geometries, according to some embodiments. The data in bar chart 700 was generated using software modeling as described above for different permutations of pupil and finger geometry. The bins on the horizontal axis bar chart 700 represent different pupils. For example, bin 708 (also "dipole X") corresponds to a pupil having dipole openings distributed along a X direction (e.g., pupil 500, FIG. 5). Bin 710 (also "dipole Y") corresponds to a pupil having a dipole openings distributed along a Y direction (e.g., pupil 504, FIG. 5). And bin 712 corresponds to a pupil having quadrupole openings distributed in a square pattern (e.g., pupil 508).

The vertical axis of bar chart 700 represents maximum local intensity fluctuations expressed as a percentage value. To clarify the units of the vertical axis of bar chart 700, we refer to plot lines 422 and 420 and lines 430 of FIG. 4B. An important parameter of local intensity fluctuations is the maximum difference (shown by lines 430). In some embodiments, a maximum difference of plot line 422, shown by lines 430, can be represented as a percentage value. For example, the intensity difference represented by the spacing of lines 430 can be divided by a nominal (e.g., average) intensity of plot line 422 and multiplied by 100 to arrive at the percentage units shown in bar chart 700. It can be seen that the nominal intensity is at about 1.94 (arbitrary units), as indicated by plot line 424. The nominal intensity can be the mean of plot lines 422 or 424, or the global minimum of plot line 420. A skilled artisan will appreciate that there are a number of methods to determine a percentage-based local intensity fluctuations. For example, a smoothing algorithm (e.g., a moving average) can be applied to plot line 422 to arrive at plot line 424. Then, by comparing values of plot lines 422 and 424, local intensity fluctuations can be determined as a function of the X coordinate. A maximum local intensity fluctuation can then extracted from the resulting LIF(x).

In bar chart 700, bars 702*n*, 704*n*, and 706*n* (white bars) represent maximum local intensity fluctuations resulting from using an illumination adjustment apparatus having fingers with non-indented geometry at the distal edge (e.g., distal edge 426, FIG. 4A). Bars 702*i*, 704*i*, and 706*i* (shaded bars) represent maximum local intensity fluctuations resulting from using an illumination adjustment apparatus having fingers with indented geometry at the distal edge, particularly distal edge 602 as shown in FIG. 6.

In bin 708, comprising bars 702*n* and 702*i*, it is seen that maximum local intensity fluctuations are reduced from approximately 0.30% to approximately 0.24% by using fingers with an indented (or teethed) distal edge—approximately a 20% reduction relative to the non-indented (or non-teethed) distal edge. Using the indented distal edge geometry also reduces maximum local intensity fluctuations when using the dipole Y (shown by bars 704*n* and 704*i*) or quadrupole pupils (shown by bars 706*n* and 706*i*). Thus embodiments of the present disclosure provide structures and methods to improve uniformity of a cross slot illumination of a beam in a lithographic apparatus.

In some embodiments using fingers with indented distal edges, a local intensity fluctuation of a cross slot illumination is reduced by at least 5%, 10%, or 20% relative to what would result if a non-indented distal edge is used. In some embodiments using fingers with indented distal edges, a local intensity fluctuation of a cross slot illumination is reduced by at least 0.02%, 0.04%, or 0.06% relative to a nominal intensity of a cross slot illumination.

The embodiments may further be described using the following clauses:

1. An illumination adjustment apparatus to adjust a cross slot illumination of a beam in a lithographic apparatus, comprising:
    a plurality of fingers configured to adjust the cross slot illumination to conform to a selected intensity profile,
    wherein each finger has a distal edge comprising at least two segments, and
    wherein the at least two segments form an indentation of the distal edge.
2. The illumination adjustment apparatus of clause 1, wherein the at least two segments are straight and/or curved.
3. The illumination adjustment apparatus of clause 1, wherein at least a portion of the distal edge is symmetric about a line of symmetry that passes through a central position of the distal edge.
4. The illumination adjustment apparatus of clause 1, wherein the distal edge comprises at least four segments, wherein the at least four segments form at least two indentations of the distal edge.
5. The illumination adjustment apparatus of clause 1, wherein the distal edge comprises at least eight segments, wherein the at least 8 segments form at least four indentations of the distal edge.
6. The illumination adjustment apparatus of clause 1, wherein the cross slot illumination comprises a substantially rectangular geometry.
7. The illumination adjustment apparatus of clause 1, wherein the cross slot illumination comprises a substantially arcuate geometry.
8. The illumination adjustment apparatus of clause 1, wherein the plurality of fingers are mounted on a corresponding plurality of actuators configured to move the each of the plurality of fingers independently to adjust the cross slot illumination.
9. A uniformity correction system to adjust a cross slot illumination of a scanning beam in a lithographic apparatus, comprising:
    a plurality of fingers configured to adjust the cross slot illumination to conform to a selected intensity profile,
    wherein each finger has a distal edge comprising at least two teeth.
10. The uniformity correction system of clause 9, wherein the at least two teeth comprise straight and/or curved segments of the distal edge.
11. The uniformity correction system of clause 9, wherein at least a portion of the distal edge is symmetric about a line of symmetry that passes through a central position of the distal edge.
12. The uniformity correction system of clause 9, wherein the distal edge comprises at least four teeth.
13. The uniformity correction system of clause 9, wherein the at least two teeth are joined at a vertex so that the vertex forms an indentation of the distal edge.
14. The uniformity correction system of clause 9, wherein the cross slot illumination comprises a substantially rectangular geometry.
15. The uniformity correction system of clause 9, wherein the cross slot illumination comprises a substantially arcuate geometry.
16. The uniformity correction system of clause 9, wherein the plurality of fingers are mounted on a corresponding plurality of actuators configured to move the each of the plurality of fingers independently to adjust the cross slot illumination.
17. A lithographic apparatus comprising:
    an illumination system configured to produce a beam of radiation, the beam comprising a cross slot illumination;
    an illumination adjustment apparatus comprising:
        a plurality of fingers configured to adjust the cross slot illumination to conform to a selected intensity profile,
        wherein each finger has a distal edge comprising at least two segments, and
        wherein the at least two segments form an indentation of the distal edge
    a support configured to support a patterning device configured to impart a pattern on the beam; and
    a projection system configured to project the patterned beam onto a substrate.
18. The lithographic apparatus of clause 17, wherein the distal edge comprises at least four segments, wherein the at least four segments form at least two indentations of the distal edge.
19. The lithographic apparatus of clause 17, wherein the distal edge comprises at least eight segments, wherein the at least 8 segments form at least four indentations of the distal edge.
20. The lithographic apparatus of clause 17, wherein:
    a local intensity fluctuation of the cross slot illumination is based on light leakage between the plurality of fingers; and
    the local intensity fluctuation is reduced by approximately at least 0.02% relative to a nominal intensity of the cross slot illumination.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "illumination adjustment apparatus," "radiation correction system," and the like can be used herein to describe an apparatus that adjusts one or more properties of a beam of radiation. For example, a uniformity correction system can be referred to as an illumination adjustment apparatus.

The terms "radiation," "beam," "light," "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An illumination adjustment apparatus to adjust a cross slot illumination of a beam in a lithographic apparatus, the illumination adjustment apparatus comprising:
a plurality of fingers configured to adjust the cross slot illumination to conform to a selected intensity profile,
wherein each finger has a distal edge comprising at least two segments, and
wherein the at least two segments form an indentation of the distal edge such that there is a portion of the indentation nearer a middle of the cross slot illumination on either side of the indentation, and
wherein at least part of the distal edge aligns with a part of the shape of the cross slot illumination at the respective finger.

2. The illumination adjustment apparatus of claim 1, wherein the at least two segments are straight and/or curved.

3. The illumination adjustment apparatus of claim 1, wherein at least a portion of the distal edge is symmetric about a line of symmetry that passes through a central position of the distal edge.

4. The illumination adjustment apparatus of claim 1, wherein the distal edge comprises at least four segments, wherein the at least four segments form at least two indentations of the distal edge.

5. The illumination adjustment apparatus of claim 1, wherein the distal edge comprises at least eight segments, wherein the at least 8 segments form at least four indentations of the distal edge.

6. The illumination adjustment apparatus of claim 1, wherein the cross slot illumination comprises a substantially rectangular geometry.

7. The illumination adjustment apparatus of claim 1, wherein the cross slot illumination comprises a substantially arcuate geometry.

8. The illumination adjustment apparatus of claim 1, wherein the plurality of fingers are mounted on a corresponding plurality of actuators configured to move the plurality of fingers independently to adjust the cross slot illumination.

9. A lithographic apparatus comprising:
an illumination system configured to produce a beam of radiation, the beam comprising a cross slot illumination;
the illumination adjustment apparatus of claim 1;
a support configured to support a patterning device configured to impart a pattern on the beam; and
a projection system configured to project the patterned beam onto a substrate.

10. The lithographic apparatus of claim 9, wherein:
a local intensity fluctuation of the cross slot illumination is based on light leakage between the plurality of fingers; and
the local intensity fluctuation is reduced by approximately at least 0.02% relative to a nominal intensity of the cross slot illumination.

11. A uniformity correction system to adjust a cross slot illumination of a scanning beam in a lithographic apparatus, the uniformity correction system comprising:
a plurality of fingers configured to adjust the cross slot illumination to conform to a selected intensity profile,
wherein each finger has a distal edge comprising at least two teeth and at least part of the distal edge aligns with a part of the shape of the cross slot illumination at the respective finger.

12. The uniformity correction system of claim 11, wherein the at least two teeth comprise straight and/or curved segments of the distal edge.

13. The uniformity correction system of claim 11, wherein at least a portion of the distal edge is symmetric about a line of symmetry that passes through a central position of the distal edge.

14. The uniformity correction system of claim 11, wherein the distal edge comprises at least four teeth.

15. The uniformity correction system of claim 11, wherein the at least two teeth are joined at a vertex so that the vertex forms an indentation of the distal edge.

16. The uniformity correction system of claim 11, wherein the cross slot illumination comprises a substantially rectangular geometry.

17. The uniformity correction system of claim 11, wherein the cross slot illumination comprises a substantially arcuate geometry.

18. The uniformity correction system of claim 11, wherein the plurality of fingers are mounted on a corresponding plurality of actuators configured to move the each of the plurality of fingers independently to adjust the cross slot illumination.

19. An illumination adjustment apparatus to adjust a cross slot illumination of a beam in a lithographic apparatus, the illumination adjustment apparatus comprising:
a plurality of fingers configured to adjust the cross slot illumination to conform to a selected intensity profile,
wherein each finger has distal edge arranged to be in the illumination and has, at the distal edge, a protrusion [[s]] such that there is a portion of the protrusion nearer a middle of the cross slot illumination than on either side of the protrusion or an indentation such that there is a portion of the indentation nearer the middle of the cross slot illumination on either side of the indentation, and
wherein at least part of the distal edge aligns with a part of the shape of the cross slot illumination at the respective finger.

20. The illumination adjustment apparatus of claim 19, wherein each finger has a plurality of protrusions or indentations and wherein at least a portion of the distal edge comprising the protrusions or indentations is symmetric about a line of symmetry that passes through a central position of the distal edge.

* * * * *